US008513994B2

(12) United States Patent
Balasubramanian

(10) Patent No.: US 8,513,994 B2
(45) Date of Patent: Aug. 20, 2013

(54) STATE MACHINE FOR DESKEW DELAY LOCKED LOOP

(75) Inventor: Suresh Balasubramanian, Shrewsbury, MA (US)

(73) Assignee: Cavium, Inc., San Jose, CA (US)

( * ) Notice: Subject to any disclaimer, the term of this patent is extended or adjusted under 35 U.S.C. 154(b) by 0 days.

(21) Appl. No.: 13/369,579

(22) Filed: Feb. 9, 2012

(65) Prior Publication Data

US 2012/0206178 A1 Aug. 16, 2012

Related U.S. Application Data

(60) Provisional application No. 61/442,920, filed on Feb. 15, 2011.

(51) Int. Cl.
*H03L 7/06* (2006.01)

(52) U.S. Cl.
USPC .......................................... 327/158; 327/149

(58) Field of Classification Search
None
See application file for complete search history.

(56) References Cited

U.S. PATENT DOCUMENTS

| | | | | |
|---|---|---|---|---|
| 7,973,581 | B2 * | 7/2011 | Mizuhashi et al. | 327/208 |
| 7,994,831 | B2 * | 8/2011 | Lee et al. | 327/158 |
| 2010/0237917 | A1 * | 9/2010 | Monma | 327/158 |

* cited by examiner

*Primary Examiner* — Cassandra Cox
(74) *Attorney, Agent, or Firm* — Hamilton, Brook, Smith & Reynolds, P.C.

(57) ABSTRACT

A state machine for a DLL ensures a given clock (DCLK) is always locked to the rising edge of an incoming reference clock (REFCLK) through the use of two additional phase detectors. The first phase detector samples the value of DCLK a given delay prior to the rising edge of REFCLK, and the second samples the value of DCLK a given delay after the rising edge of REFCLK. The additional information provided by these two phase detectors enables a determination as to whether we are close to the falling edge of REFCLK, and, if so, add enough delay to DCLK to ensure that the DLL locks only to the rising edge of REFCLK and never accidentally to the falling edge.

11 Claims, 6 Drawing Sheets

STATE MACHINE FOR DESKEW DELAY LOCKED LOOP

RELATED APPLICATION

This application claims the benefit of U.S. Provisional Application No. 61/442,920, filed on Feb. 15, 2011. The entire teachings of the above applications are incorporated herein by reference.

BACKGROUND

Modern microprocessors have a large number of clock domains in order to be able to achieve the best performance for targeted applications while optimizing for overall chip power consumption. In order to facilitate deterministic data transfer across these clock domains the clocks are typically aligned using a state-machine controlled digital delay-locked loop (DLL). Typically these clocks are at the end of long insertion delay distribution networks and hence susceptible to supply-noise induced jitter. When this jitter becomes comparable to the unit increment of the delay line, it can cause the state machine to falsely align the clock to the incorrect edge of the reference clock.

SUMMARY

Embodiments of the present invention provide a state machine for a DLL that ensures a given clock (DCLK) is always locked to the rising edge of an incoming reference clock (REFCLK) through the use of two additional phase detectors. The first phase detector samples the value of DCLK a given delay prior to the rising edge of REFCLK, and the second samples the value of DCLK a given delay after the rising edge of REFCLK. The additional information provided by these two phase detectors enables a determination as to whether we are close to the falling edge of REFCLK, and, if so, add enough delay to DCLK to ensure that the DLL locks only to the rising edge of REFCLK and never accidentally to the falling edge.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

A description of example embodiments of the invention follows.

A typical locking state machine for a deskew delay locked loop (DLL) uses the output of a single bang-bang phase detector to add delay to a given clock (DCLK) to align it with the rising edge of an incoming reference clock. Embodiments of the present invention ensure that a given clock (DCLK) is always locked to the rising edge of an incoming reference clock (REFCLK) through the use of two additional phase detectors. The first of phase detector samples the value of DCLK a given delay prior to the rising edge of REFCLK, and the second samples the value of DCLK a given delay after the rising edge of REFCLK. The additional information from these two phase detectors allows a determination of whether we are close to the falling edge of REFCLK, and, if so, add enough delay to DCLK to ensure that we only lock to the rising edge of REFCLK and never to the falling edge.

Figure 1A:
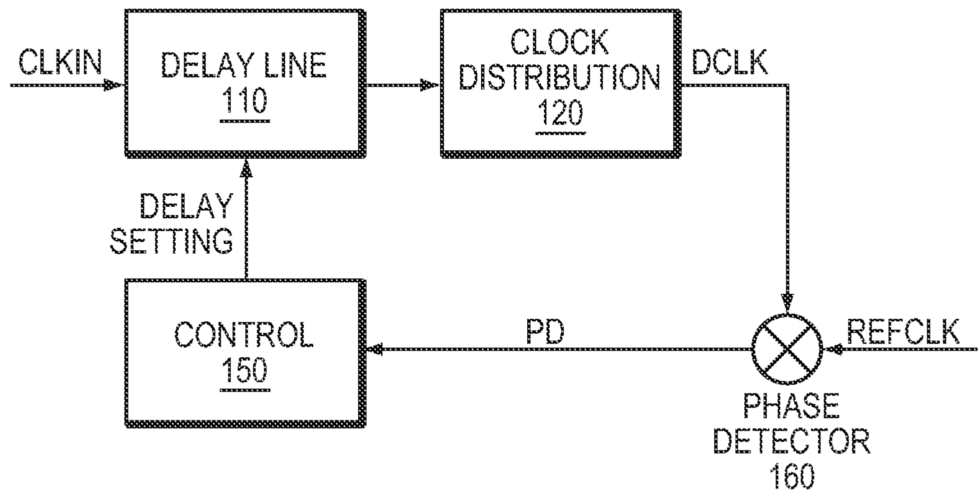
FIG. 1A is a block diagram of a typical deskew DLL.

FIG. 1A is a block diagram illustrating a typical deskew DLL circuit. Here, a variable delay line 110 receives a clock input signal CLKIN, and outputs a delayed clock signal to a clock distribution block 120. The clock distribution block outputs a distributed clock signal DCLK. The typical deskew DLL circuit operates to ensure the clock DCLK is locked to a reference clock REFCLK. Thus, a phase detector 160 compares the clock DCLK against the REFCLK and outputs a corresponding signal PD indicating the phase difference between the signals. A control block 150 receives the signal PD and, in response, controls the delay line via a delay setting signal to adjust the phase of the clock DCLK. Operation of the control block 150 is described in further detail below with reference to FIG. 1B.

Figure 1B:
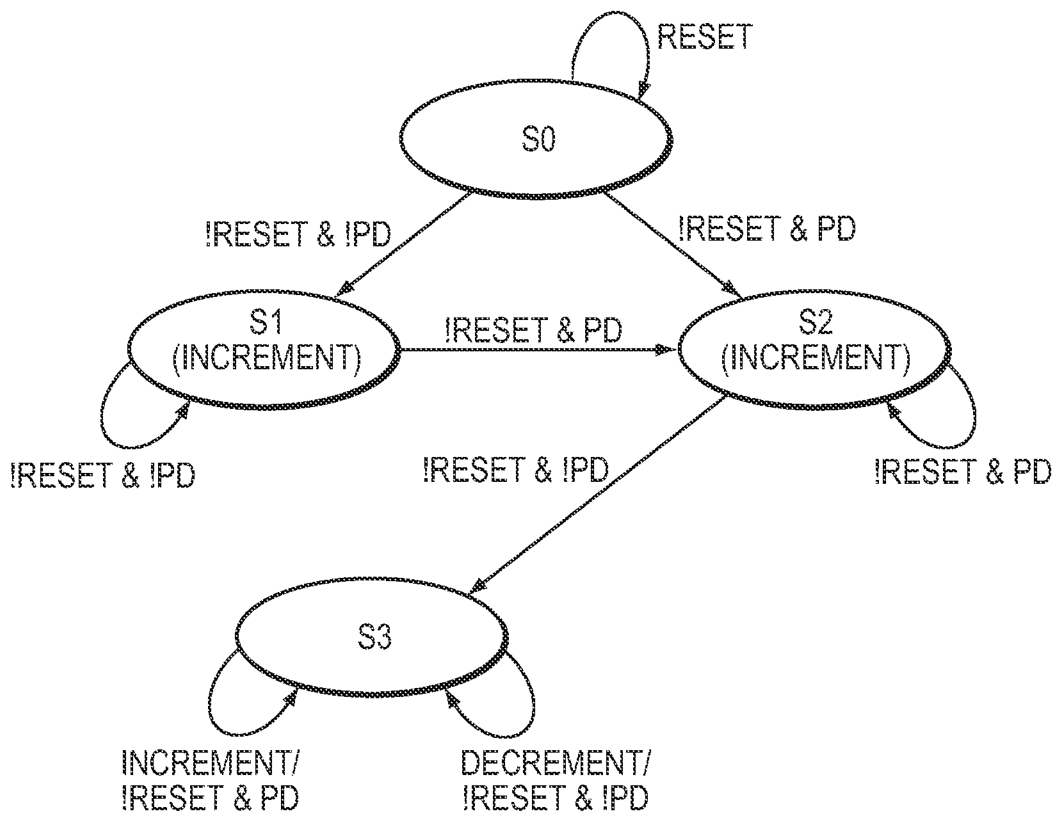
FIG. 1B is a state diagram of a typical deskew DLL state machine.

FIG. 1B illustrates a deskew DLL state machine embedded inside the control block 150 shown in FIG. 1A. The state machine is used to lock a clock at the end of a clock distribution network (DCLK) to an incoming reference clock (REFCLK).

Under a typical locking procedure, the delay line setting (DELAY SETTING) is first held at the minimum delay state under reset (state S0). It uses a single binary phase detector (e.g., a bang-bang phase detector). The state machine moves to either S1 or S2 depending on the value of the phase detector. It moves to S1 if the rising edge of REFCLK samples the low state of DCLK. The delay line setting is incremented until the rising edge of REFCLK samples the high state of DCLK and the phase detector state changes to a high, upon which the state machine moves to state S2. The delay line setting continues to be incremented in S2 until the point where the rising edge of REFCLK samples the low state of DCLK and the phase detector changes state again, to state S3, upon which the lock signal is asserted.

Figure 2A:
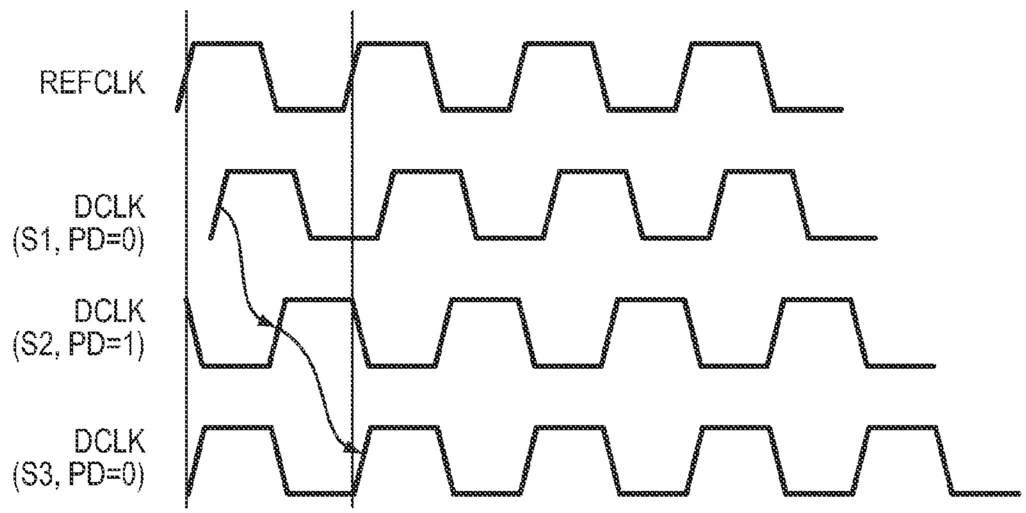
FIGS. 2A-B are timing diagrams of operation of a typical deskew DLL.
Figure 2B:
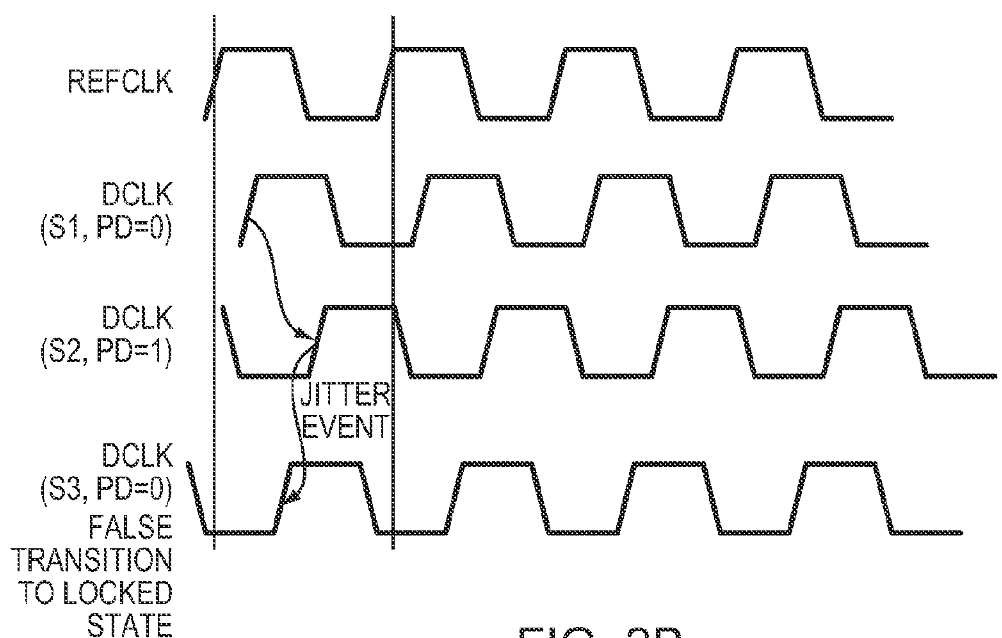

FIG. 2A is a timing diagram showing the clock waveforms during a normal lock acquisition of the typical deskew DLL circuit described above. Here, the clock signal DCLK is shown against the reference clock REFCLK as the control block 150 (FIG. 1A) transitions between states S1 through S3 as shown in FIG. 2B. Between states S1 and S3, the control block 150 increases the delay of the clock signal DCLK incrementally until a lock state is reached at state S3.

FIG. 2B is a timing diagram showing the clock waveforms of the typical deskew DLL circuit described above under a clock jitter event due to supply noise. The jitter event occurs at a time between the transition between states S2 and S3 by the state machine, and distorts the clock signal DCLK by moving the phase of the signal in a manner not intended by the control block. It can be seen that this state machine, and by extension the typical deskew DLL circuit, is susceptible to locking the clock signal DLL to the falling edge of the reference clock REFCLK if a clock jitter event occurs after the state machine moves into S2, causing the phase detector to flip again and, in turn, causing the state machine to move into S3 (the locked state). If the state machine continues to adjust its delay based on the PD signal, it starts decrementing the delay setting taking the delay line back to its original minimum delay setting. This condition can occur under a number of circumstances. For example, the unit delay increment of the delay line may be smaller than the deadzone of the phase detector. The deadzone of a phase detector is defined as the minimum time separation required between the edges of the two input clocks for the output (PD) to behave correctly. Alternatively, a clock jitter event may cause either the REFCLK edge to move forward or the DCLK to move backward when the DCLK rising edge is in the vicinity of the REFCLK falling edge. As a result, the typical deskew DLL circuit enters an irrecoverable state where the state machine indicates lock while the delay line is stuck at its minimum setting.

Previous implementations of digital cycle-locked DLLs have used an array of phase detectors that compare rising edge of the input clock with the output of every stage along the delay chain. The main purpose of using an array of phase detectors is to achieve a fast lock. Such a design typically requires the same number of phase detectors as delay stages and a significantly more complicated state machine that can process all the signals. Also these implementations work only when the two clocks are of the same frequency. The proposed scheme involves the use of just two additional phase detectors and the state machine uses just one additional state. Also this scheme can lock a faster clock to a clock whose frequency is a sub-multiple (divide by 2, 3, 4, etc.).

Figure 3:
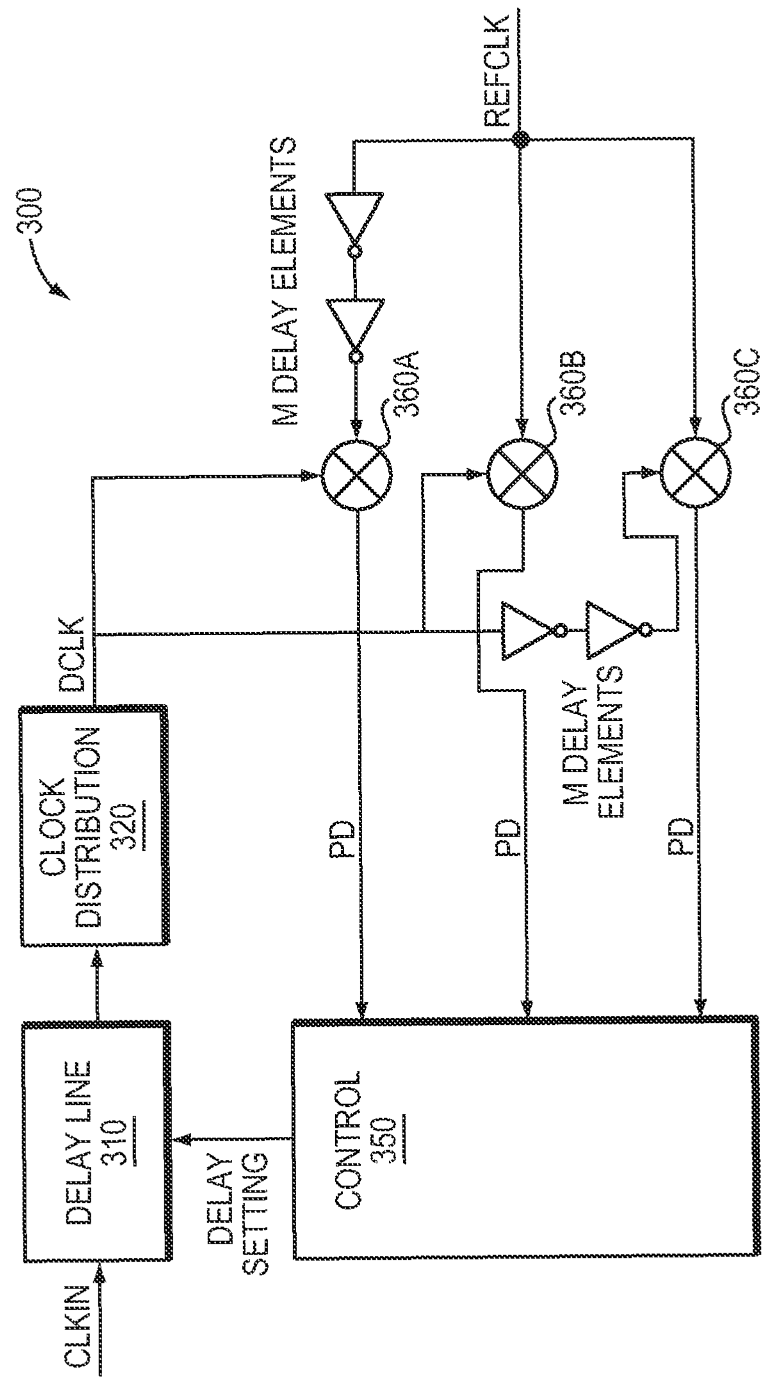
FIG. 3 is a block diagram of a deskew DLL in an example embodiment.

FIG. 3 is a block diagram of a deskew DLL circuit 300 in an example embodiment. Here, a variable delay line 310 receives a clock input signal CLKIN, and outputs a delayed clock signal to a clock distribution block 320. The clock distribution block outputs a distributed clock signal DCLK. Phase detectors 360A-C compare the clock DCLK against the REFCLK and outputs corresponding signals PDL, PD, PDR indicating the phase difference between the signals. The clock DCLK may have a frequency being a submultiple of the reference clock REFCLK. Conversely, the reference clock REFCLK may have a frequency being a submultiple of the reference clock DCLK.

The phase detector 360A compares the clock signal DCLK against a reference clock REFCLK that is delayed by a number ("M") delay elements (e.g., 2 delay elements as shown). The phase detector 360B compares the clock signal DCLK against the reference clock REFCLK. The phase detector 360C compares the clock signal DCLK, delayed by a number ("M") delay elements (e.g., 2 delay elements as shown), against the reference clock REFCLK. Thus, three phase detector outputs are generated: Signal PD is the value of DCLK sampled by the rising edge of REFCLK; PDL is the value of DCLK sampled by the rising edge of a delayed version of REFCLK; and PDR is the value of a delayed version of DCLK sampled by REFCLK. A control block 350 receives the signals PDL, PD, PDR and, in response, controls the delay line via a delay setting signal to adjust the phase of the clock DCLK.

The circuit 300 provides for detecting the proximity of the REFCLK edge to a rising or a falling DCLK edge by using two additional phase detectors. In particular, the circuit 300 enables a state machine to detect the value of the DCLK signal two delay stages prior to nominal REFCLK (via signal PDL) and two delay stages after nominal REFCLK (via signal PDR). Alternatively, a number of delay stages other than two delay stages as shown can be implemented, thereby configuring a window for comparison subject to the cycle time limitations of the faster clock (DCLK). In order to accurately compensate for jitter, the delay may be larger than the deadzone of the phase detector plus the sum of the long term clock jitter on REFCLK and DCLK. Implementing the delay using the delay elements of the DLL provides a count by which to increment the delay line to take it out of the proximity to the falling edge of REFCLK. Operation of the control block 350 is described in further detail below with reference to FIG. 4.

Figure 4:
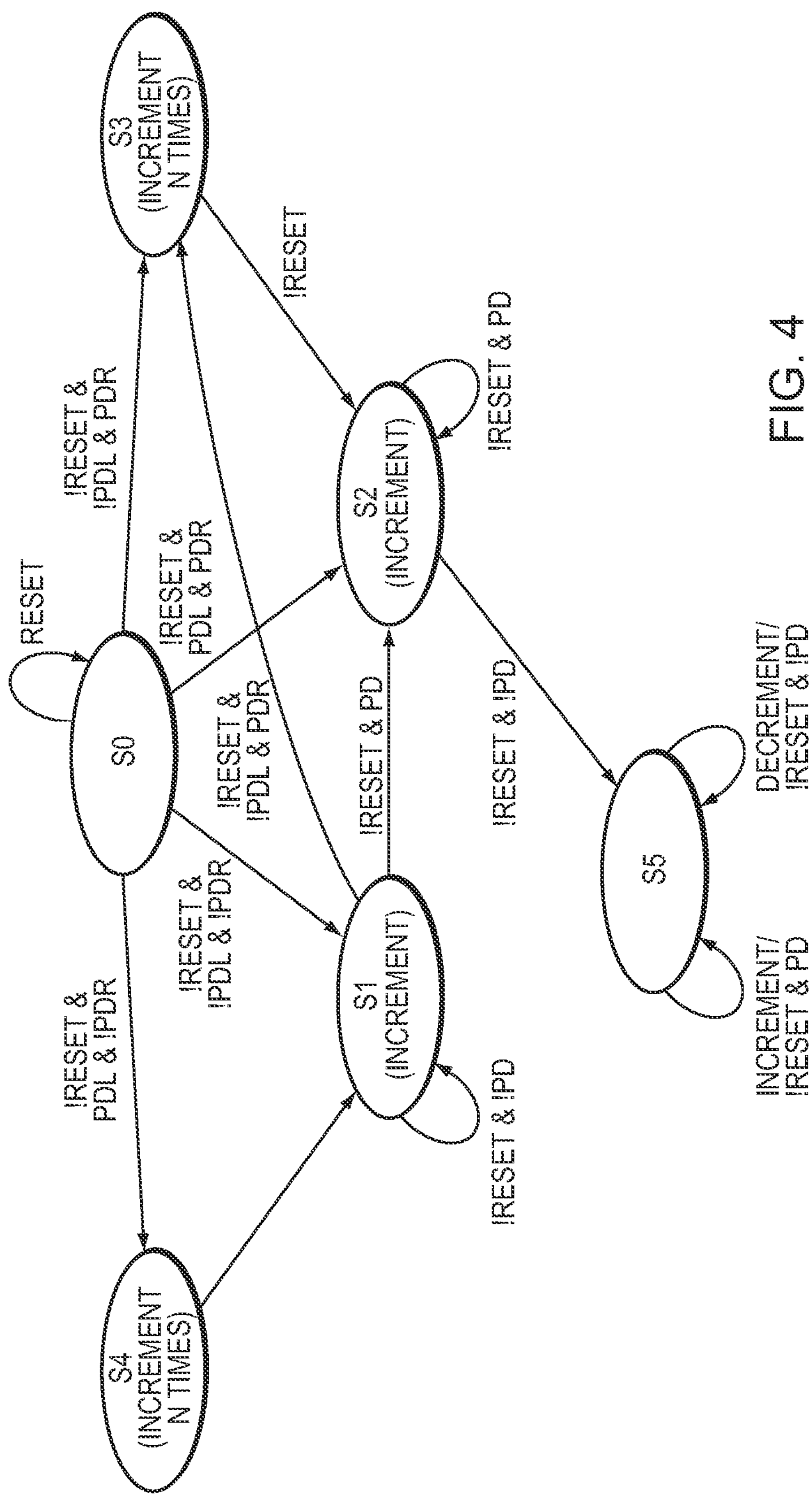
FIG. 4 is a state diagram of a state machine in an example embodiment.
Figure 5:
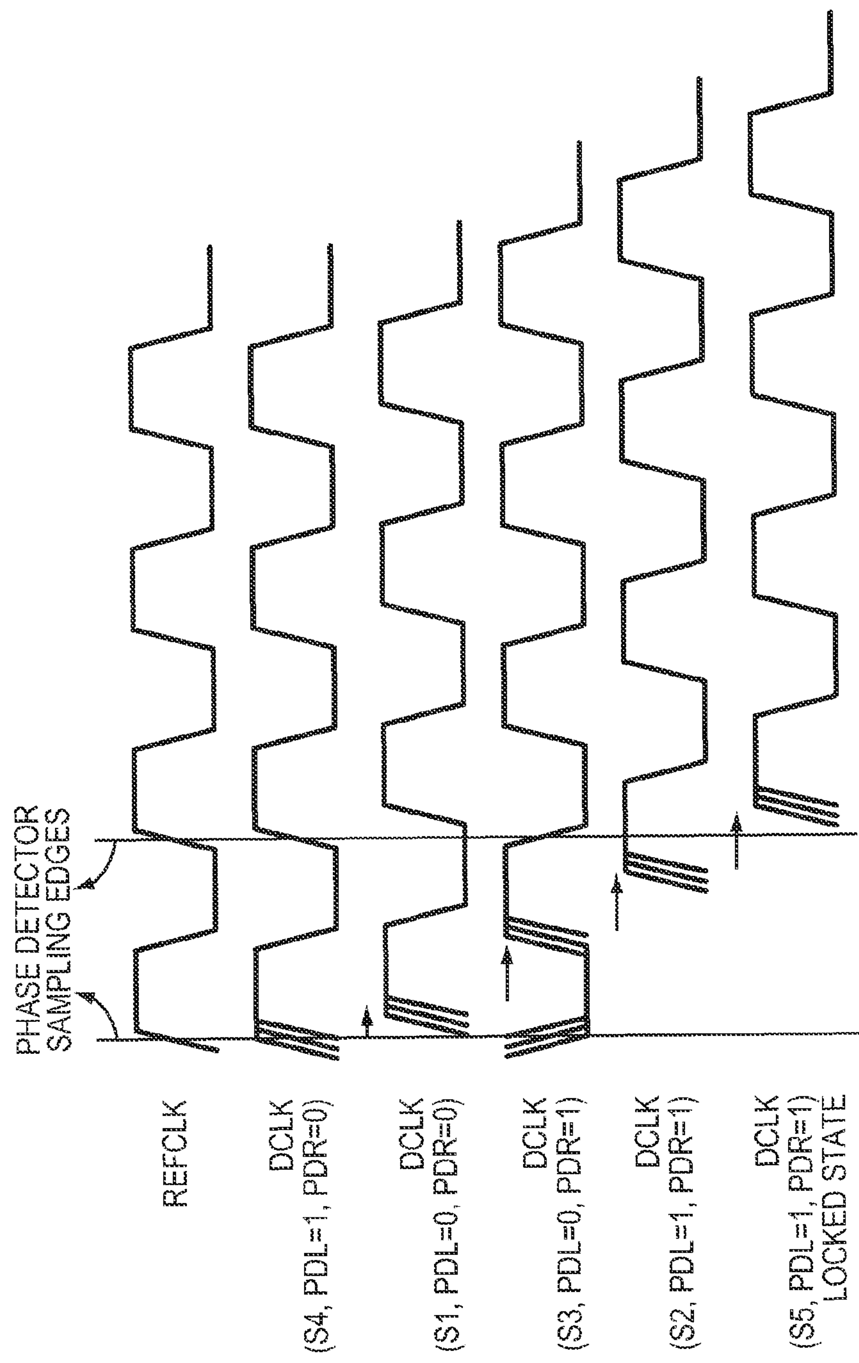
FIG. 5 is a timing diagram showing operation of the deskew DLL in an example embodiment.

FIG. 4 illustrates a deskew DLL state machine implemented by the control block 350 shown in FIG. 3. The state machine is used to lock a clock at the end of a clock distribution network (DCLK) to an incoming reference clock (REFCLK). FIG. 5 is a timing diagram illustrating the clock waveforms during a lock acquisition of the deskew DLL circuit.

With reference to FIGS. 4 and 5, at the initial state S0, a first change in state is determined by the values of PDL & PDR. If the rising edge of DCLK is close to the rising edge of REFCLK(PDL=1,PDR=0), the state is moved to S4. In this state, the delay line setting is unconditionally incremented N (N>2M) times to move away from the vicinity of the rising edge of REFCLK and is then unconditionally moved to state S1 thereafter. The delay setting in state S1 is continually incremented until the rising edge of DCLK is close to the falling edge of REFCLK(PDL=0,PDR=1) whereupon the state is moved to state S3. Here, the delay line setting is again unconditionally incremented N (N>2M) times to move away from the vicinity of the falling edge of REFCLK before unconditionally moving to state S2.

At state S2, the delay setting is continually incremented until PD transitions low, upon which we move to state S5 to indicate a locked state. The number N may be selected such that the delay increment is larger than the time window between PDL & PDR.

As a result of the deskew DLL circuit 300 of FIG. 3 operating in accordance with the state machine of FIG. 4, the deskew DLL prevents false locking as a result of jitter by providing greater jitter tolerance. This tolerance is achieved, in part, by adding two additional phase detectors that provide the control block with edge proximity information, and providing a state machine configured to control the DLL based on this information. In alternative embodiments, the circuit may be configured to lock a rising or falling edge of the delayed clock signal DCLK to a rising or falling edge of the reference clock REFCLK.

Figure 6:
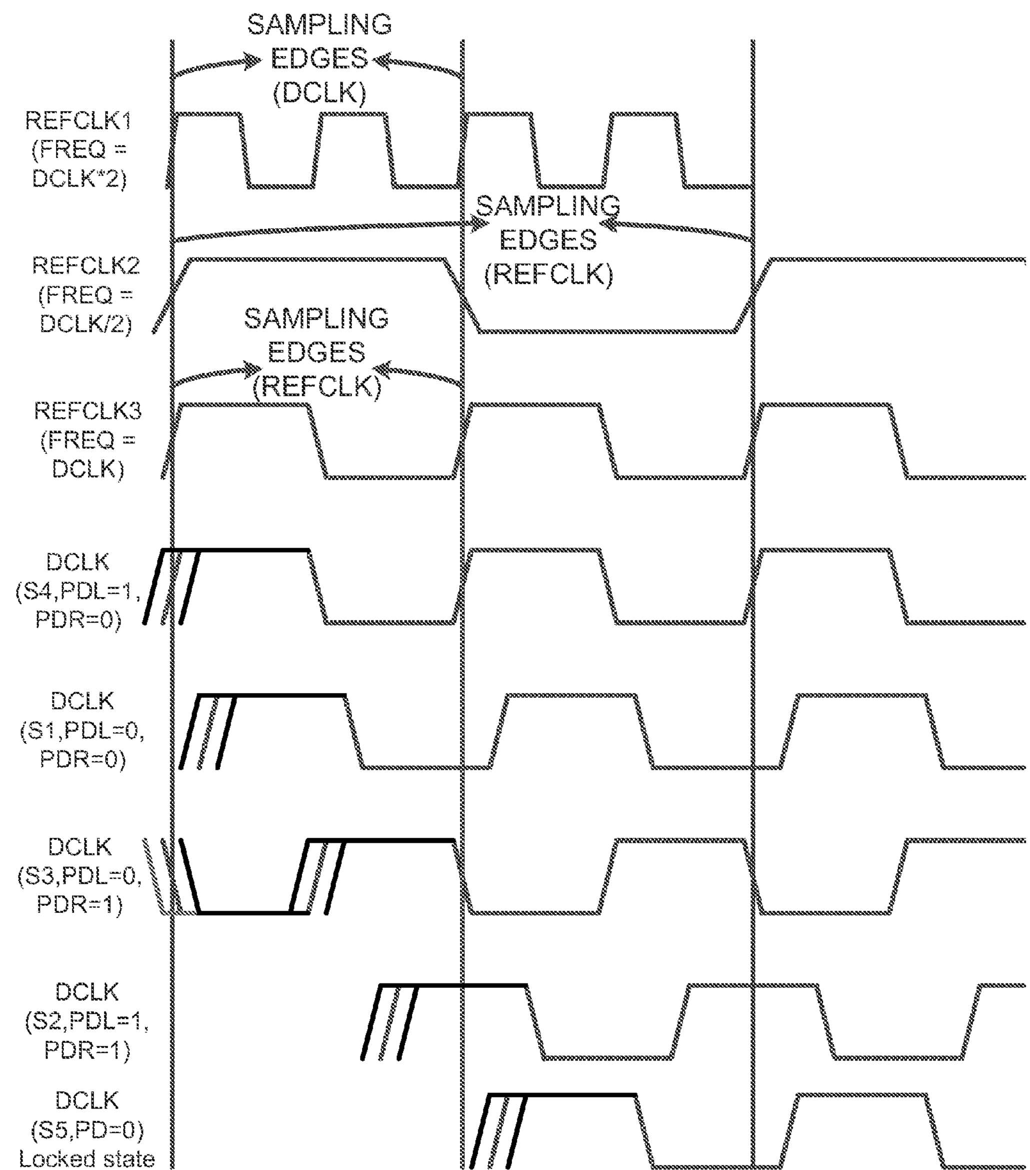
FIG. 6 is a timing diagram showing operation of the deskew DLL in an example embodiment.

FIG. 6 is a timing diagram illustrating the clock waveforms during a lock acquisition of the deskew DLL circuit in example embodiments. The timing diagram is comparable to the timing diagram of FIG. 5, where both timing diagrams show the waveforms of the given clock DCLK at each state of the state diagram in FIG. 4. In FIG. 5, the reference clock REFCLK has a frequency equal to the frequency of the given clock DCLK. In FIG. 6, a comparable reference clock is shown as REFCLK3. In addition to REFCLK3, two additional reference clocks are shown, REFCLK1 and REFCLK2, which may be implemented in further embodiments. Reference clock REFCLK1 has a frequency that is a multiple (e.g., a multiple of two) of the frequency of the given clock DCLK. The clock DCLK thus has a frequency being a submultiple of the reference clock REFCLK1. Reference clock REFCLK2 has a frequency that is a submultiple (e.g., a multiple of ½) of the frequency of the given clock DCLK.

While this invention has been particularly shown and described with references to example embodiments thereof, it will be understood by those skilled in the art that various changes in form and details may be made therein without departing from the scope of the invention encompassed by the appended claims.

What is claimed is:

1. A deskew DLL circuit comprising:

a delay line configured to receive a clock signal input and output a delayed clock signal;

a first phase detector configured to compare the delayed clock signal against a reference clock;

a second phase detector configured to compare the delayed clock signal against a delayed version of the reference clock;

a third phase detector configured to compare a delayed version of the delayed clock signal against the reference clock; and a control block configured to control a delay of the delay line based on outputs of the first, second and third phase detectors;

wherein the control block further comprises a state machine configured to determine a proximity of a rising edge of the clock signal to an edge of the reference clock, the state machine controlling the delay line based on whether the edge of the reference clock is a rising edge or a falling edge.

2. The circuit of claim 1, wherein the state machine is configured to determine the proximity based on at least one of the outputs of the first, second and third phase detectors.

3. The circuit of claim 1, wherein the state machine is configured to transition from an initial state to a selected state based on the output of at least two of the outputs of the first, second and third phase detectors.

4. The circuit of claim 3, wherein the at least two of the outputs include the outputs of the second and third phase detectors.

5. The circuit of claim 1, wherein the state machine is configured to transition to a locked state based on the output of the first phase detector.

6. The circuit of claim 1, wherein the state machine, based on the outputs of the second and third phase detectors, is configured to transition to a state whereby the delayed clock signal is incremented a fixed number of delay units.

7. The circuit of claim 1, wherein the control block is configured to control the delay of the delay line to lock an edge of the delayed clock signal to an edge of the reference clock.

8. The circuit of claim 7, wherein the edge of the delayed clock signal and the edge of the reference clock are rising edges.

9. The circuit of claim 7, wherein the edge of the delayed clock signal and the edge of the reference clock are falling edges.

10. A deskew DLL circuit comprising:

a delay line configured to receive a clock signal input and output a delayed clock signal;

a first phase detector configured to compare the delayed clock signal against a reference clock;

a second phase detector configured to compare the delayed clock signal against a delayed version of the reference clock;

a third phase detector configured to compare a delayed version of the delayed clock signal against the reference clock; and a control block configured to control a delay of the delay line based on outputs of the first, second and third phase detectors;

wherein the delayed clock signal has a frequency being a submultiple of the reference clock.

11. A deskew DLL circuit comprising:

a delay line configured to receive a clock signal input and output a delayed clock signal;

a first phase detector configured to compare the delayed clock signal against a reference clock;

a second phase detector configured to compare the delayed clock signal against a delayed version of the reference clock;

a third phase detector configured to compare a delayed version of the delayed clock signal against the reference clock; and a control block configured to control a delay of the delay line based on outputs of the first, second and third phase detectors;

wherein the reference clock has a frequency being a submultiple of the delayed clock signal.

* * * * *